(12) United States Patent
Kim et al.

(10) Patent No.: US 12,347,644 B2
(45) Date of Patent: Jul. 1, 2025

(54) SUSCEPTOR ASSEMBLY FOR PLASMA APPARATUS

(71) Applicant: ASM IP Holding B.V., Almere (NL)

(72) Inventors: Sam Kim, Chandler, AZ (US); Koji Tanaka, Hino (JP)

(73) Assignee: ASM IP Holding B.V., Almere (NL)

( * ) Notice: Subject to any disclaimer, the term of this patent is extended or adjusted under 35 U.S.C. 154(b) by 541 days.

(21) Appl. No.: 17/471,339

(22) Filed: Sep. 10, 2021

(65) Prior Publication Data

US 2022/0084786 A1 Mar. 17, 2022

Related U.S. Application Data

(60) Provisional application No. 63/077,771, filed on Sep. 14, 2020.

(51) Int. Cl.
*H01J 37/32* (2006.01)

(52) U.S. Cl.
CPC .. *H01J 37/32091* (2013.01); *H01J 37/32568* (2013.01); *H01J 37/32577* (2013.01); *H01J 37/32724* (2013.01); *H01J 2237/3321* (2013.01); *H01J 2237/334* (2013.01)

(58) Field of Classification Search
CPC ........... H01J 37/32091; H01J 37/32174; H01J 37/32532; H01J 37/32541; H01J 37/3255; H01J 37/32568; H01J 37/32577; H01J 37/32715; H01J 37/32724; H01J 2237/3321; H01J 2237/334; C23C 16/44; C23C 16/4401; C23C 16/45533; C23C 16/4581; C23C 16/4586; C23C 16/46; C23C 16/50; C23C 16/505; C23C 16/5096; C23C 14/50; C23C 14/541; C23C 14/564; H01L 21/67069; H01L 21/67103; H01L 21/68714
See application file for complete search history.

(56) References Cited

U.S. PATENT DOCUMENTS

| | | | |
|---|---|---|---|
| 10,840,088 B2 | 11/2020 | Venkatasubramanian | |
| 2013/0092086 A1* | 4/2013 | Keil | H01J 37/3244 118/723 E |
| 2017/0076921 A1* | 3/2017 | Sakiyama | H01J 37/32935 |
| 2017/0306494 A1* | 10/2017 | Lin | H01J 37/32082 |
| 2020/0251371 A1 | 8/2020 | Kuno et al. | |

* cited by examiner

*Primary Examiner* — Benjamin Kendall
*Assistant Examiner* — Joshua Reyes
(74) *Attorney, Agent, or Firm* — Snell & Wilmer L.L.P.

(57) ABSTRACT

A susceptor assembly for a reactor system may provide various plasma control benefits. The susceptor assembly includes a body, a heater element, a first electrode, and a second electrode, according to various embodiments. The body may have a top surface, a side surface, and a bottom surface, wherein the top surface is a substrate support surface. The heater element may be embedded within the body. The first and second electrodes may also be embedded within the body of the susceptor assembly, with the first electrode disposed between the heater element and the top surface of the body. The second electrode may be generally disposed proximate at least one of the side surface and the bottom surface.

8 Claims, 12 Drawing Sheets

SUSCEPTOR ASSEMBLY FOR PLASMA APPARATUS

CROSS-REFERENCE TO RELATED APPLICATIONS

This application claims the benefit of and priority to U.S. Provisional Patent Application No. 63/077,771 filed Sep. 14, 2020 titled SUSCEPTOR ASSEMBLY FOR PLASMA APPARATUS, the disclosure of which is hereby incorporated by reference in its entirety.

FIELD OF THE DISCLOSURE

The present disclosure relates generally to a semiconductor processing or reactor system having a susceptor assembly, and particularly a capacitively coupled reactor system having a susceptor assembly that facilitates plasma control.

BACKGROUND OF THE DISCLOSURE

Reaction chambers may be used for processing a substrate therein (e.g., depositing various material layers onto semiconductor substrates). For example, a substrate may be placed on a susceptor inside a reaction chamber and one or both of the substrate and the susceptor may be heated to a desired temperature set point. In an example substrate treatment process, one or more reactant gases may be passed over a heated substrate, causing the deposition of a thin film of material on the substrate surface. Throughout subsequent deposition, doping, lithography, etch, and other processes, these layers may be made into integrated circuits.

Semiconductor processing often includes plasma processing (e.g., plasma cleaning, plasma etching or plasma-enhanced deposition). Plasma processing generally involves generating a plasma of one or more reactant gases, with the plasma facilitating cleaning, film deposition and/or etching. However, a conventional plasma apparatus often results in the inadvertent generation of parasitic plasma in undesired locations within the reaction chamber. This parasitic plasma may have various adverse effects, such as decreased thickness uniformity of a deposited film and/or film residue deposition on surfaces/walls of the reactor.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

Disclosed herein, according to various embodiments, is a susceptor assembly for a reactor system. The susceptor assembly includes a body, a heater element, a first electrode, and a second electrode, according to various embodiments. The body may have a top surface, a side surface, and a bottom surface, wherein the top surface is a substrate support surface. The heater element may be embedded within the body. The first and second electrodes may also be embedded within the body of the susceptor assembly, with the first electrode disposed between the heater element and the top surface of the body. The second electrode may be generally disposed proximate at least one of the side surface and the bottom surface.

In various embodiments, the second electrode comprises a mesh material. The bulk material of the body of the susceptor assembly may be a ceramic material. The second electrode is configured to be electrically grounded to suppress parasitic plasma around at least one of the side surface and the bottom surface while the first electrode is configured to operably generate a processing plasma above the top surface, according to various embodiments. The second electrode may extend proximate the bottom surface such that the heater element is disposed between the first electrode and the second electrode.

Also disclosed herein, according to various embodiments, is a reactor system comprising a capacitively coupled plasma configuration. The reactor system may include a susceptor assembly and a housing. The susceptor assembly may include the features mentioned above, and the housing may include an upper portion and a lower portion. The housing may also define a chamber within which the susceptor assembly is disposed. The body of the susceptor assembly may generally divide the chamber into an upper chamber, defined between the upper portion of the housing and the top surface of the body of the susceptor assembly, and a lower chamber, defined between the bottom surface of the body of the susceptor assembly and the lower portion of the housing. The reactor system may also include a third electrode disposed above the top surface of the body of the susceptor assembly.

The reactor system may further include an RF generator electrically coupled in RF power providing communication to one of the first electrode and the third electrode, with the other of the first electrode and the third electrode electrically grounded, thereby operably generating an electric field between the first electrode and the third electrode to create a processing plasma above the top surface of the body of the susceptor assembly. The second electrode is electrically grounded to operably suppress parasitic plasma around at least one of the side surface and the bottom surface, according to various embodiments. The third electrode may be electrically insulated from the lower portion of the housing. In various embodiments, the RF generator is a first RF generator and the reactor system further comprises a second RF generator. The first electrode may comprise a first zone and a second zone, and the first RF generator may be electrically coupled in RF power providing communication with the first zone and the second RF generator may be separately electrically coupled in RF power providing communication with the second zone.

In various embodiments, the second electrode extends proximate the bottom surface such that the heater element is disposed between the first electrode and the second electrode. In such a configuration, the reactor system further includes an RF generator electrically coupled in RF power providing communication to the second electrode, with the lower portion of the housing electrically grounded, thereby operably generating an electric field between the second electrode and the lower portion of the housing to create a cleaning plasma below the bottom surface of the body of the susceptor assembly. In various embodiments, the RF generator is a first RF generator and the reactor system further comprises a second RF generator. The second electrode comprises a first zone and a second zone, according to various embodiments. The first RF generator is electrically coupled in RF power providing communication with the first zone and the second RF generator is separately electrically coupled in RF power providing communication with the second zone, according to various embodiments.

In various embodiments, the reactor system includes a metal plate disposed in the lower chamber below the bottom surface of the body of the susceptor assembly, wherein the metal plate comprises a fourth electrode that is electrically insulated from the lower portion of the housing. A ceramic insulator may be disposed between the metal plate and the lower portion of the housing. The reactor system may include an RF generator electrically coupled in RF power providing communication to one of the second electrode and the fourth electrode, with the other of the second electrode and the fourth electrode electrically grounded, thereby operably generating an electric field between the second electrode and the fourth electrode to create a cleaning plasma below the bottom surface of the body of the susceptor assembly. The metal plate may include at least one of a protruded surface, an extruded surface, and a conical extruded surface. In various embodiments, the bulk material of the susceptor assembly is metal (e.g., a metallic material).

Also disclosed herein, according to various embodiments, is a capacitively coupled plasma apparatus. The capacitively coupled plasma apparatus may include a susceptor assembly, a housing, and a third electrode, as introduced above. The capacitively coupled plasma apparatus may further include an RF generator electrically coupled in RF power providing communication to the second electrode, with the lower portion of the housing electrically grounded, thereby operably generating an electric field between the second electrode and the lower portion of the housing to create a cleaning plasma below the bottom surface of the body of the susceptor assembly.

For the purpose of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the embodiments disclosed herein may be carried out in a manner that achieves or optimizes one advantage or group of advantages as taught or suggested herein without necessarily achieving other objects or advantages as may be taught or suggested herein.

All of these embodiments are intended to be within the scope of the disclosure. These and other embodiments will become readily apparent to those skilled in the art from the following detailed description of certain embodiments having reference to the attached figures, the disclosure not being limited to any particular embodiment(s) discussed.

BRIEF DESCRIPTION OF THE DRAWING FIGURES

While the specification concludes with claims particularly pointing out and distinctly claiming what are regarded as embodiments of the disclosure, the advantages of embodiments of the disclosure may be more readily ascertained from the description of certain examples of the embodiments of the disclosure when read in conjunction with the accompanying drawings. Elements with the like element numbering throughout the figures are intended to be the same.

Figure 7A:
Figure 7B:
Figure 7C:
Figure 8:
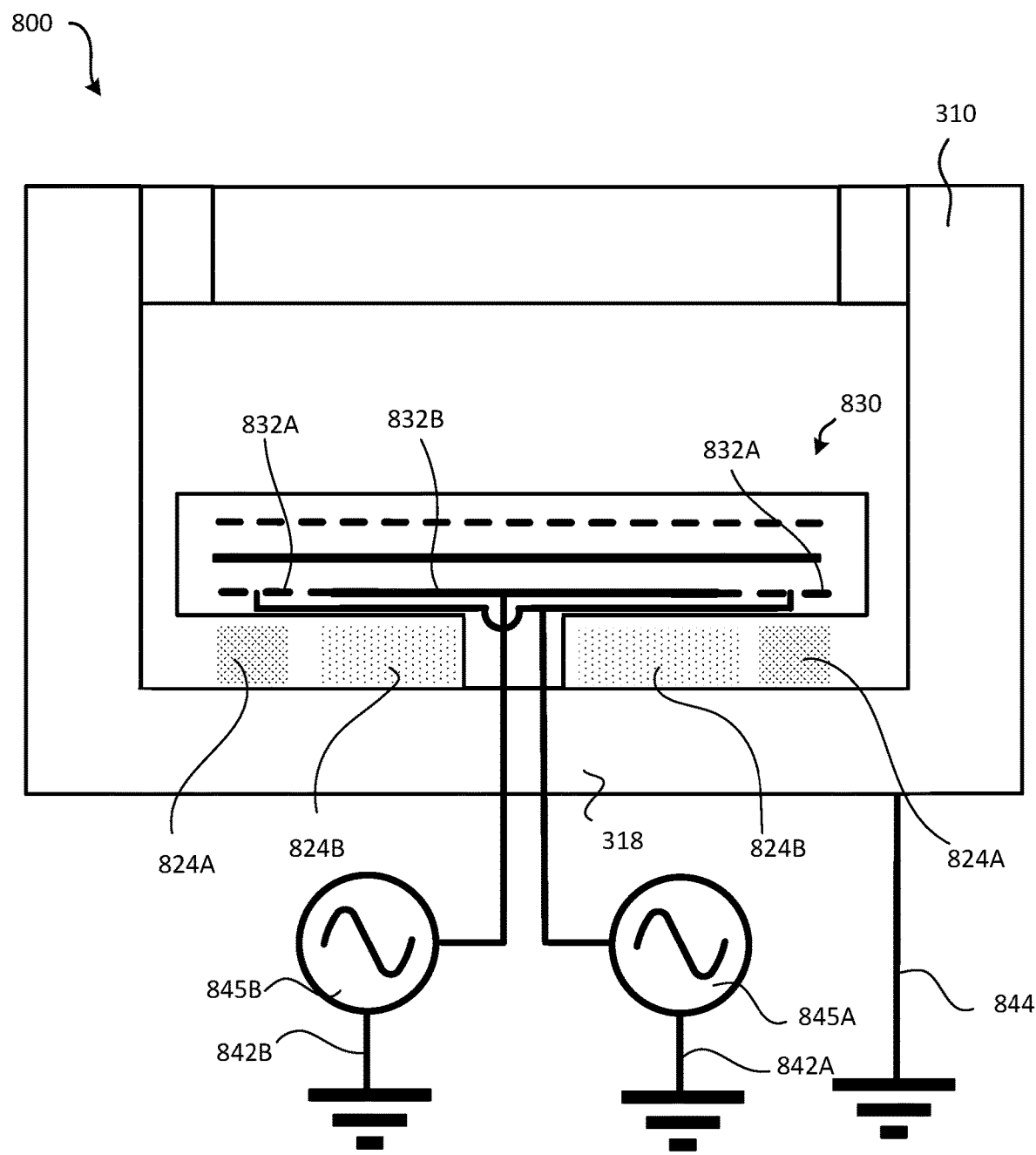
Figure 9:
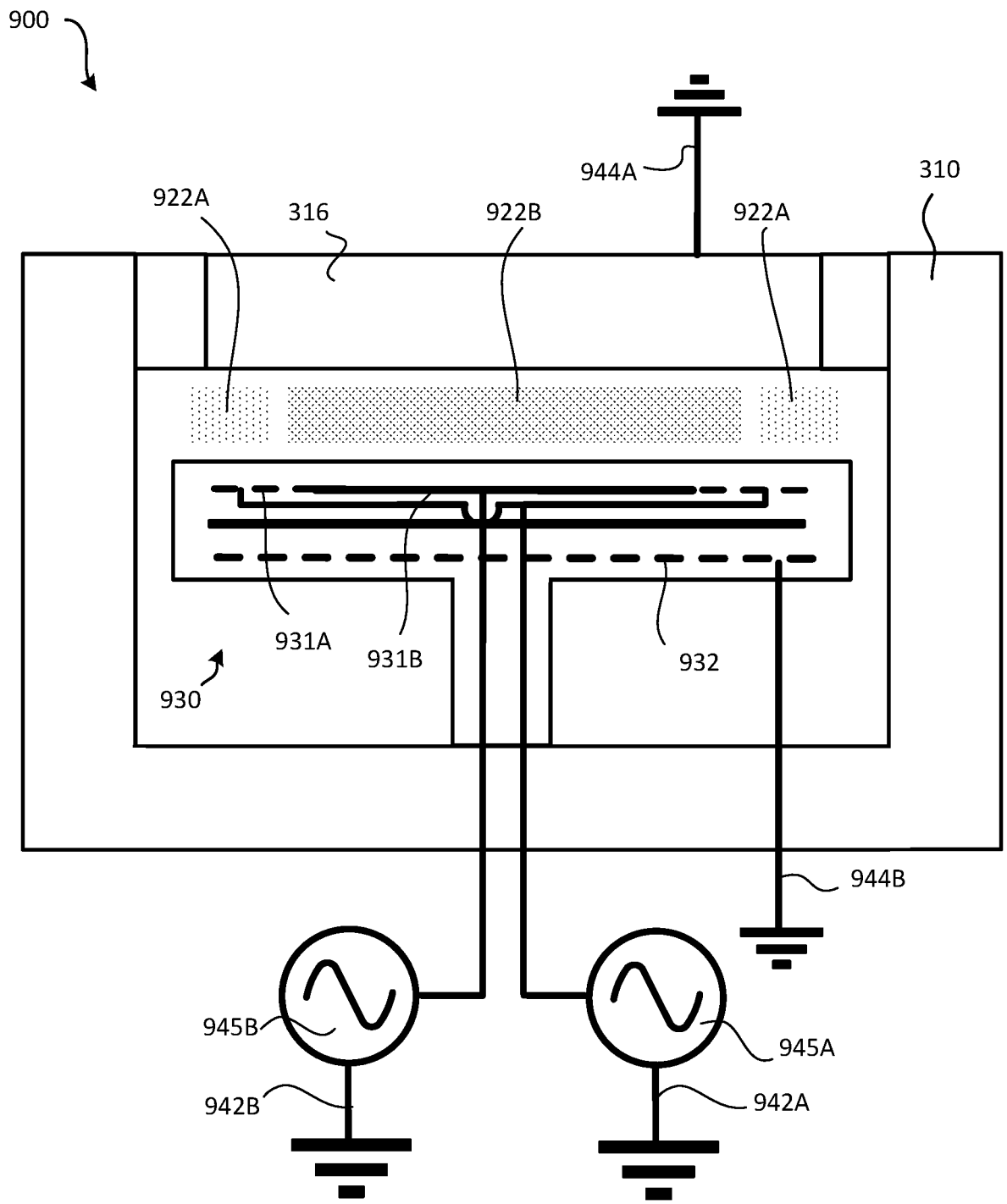

FIGS. 7A, 7B, and 7C are schematic cross-sectional views of various surface features of various implementations of a metal plate of a reactor system, in accordance with various embodiments;

FIG. 8 is a schematic cross-sectional view of a reactor system having a susceptor assembly and a multi-zone capacitively coupled plasma configuration for generating multiple zones of plasma below the susceptor assembly, in accordance with various embodiments; and FIG. 9 is a schematic cross-sectional view of a reactor system having a susceptor assembly and a multi-zone capacitively coupled plasma configuration for generating multiple zones of plasma above the susceptor assembly, in accordance with various embodiments.

DETAILED DESCRIPTION

Although certain embodiments and examples are disclosed below, it will be understood by those in the art that the disclosure extends beyond the specifically disclosed embodiments and/or uses of the disclosure and obvious modifications and equivalents thereof. Thus, it is intended that the scope of the disclosure should not be limited by the particular embodiments described herein.

The illustrations presented herein are not meant to be actual views of any particular material, apparatus, structure, or device, but are merely representations that are used to describe embodiments of the disclosure.

As used herein, the term "substrate" may refer to any underlying material or materials that may be used, or upon which, a device, a circuit, or a film may be formed.

As used herein, the term "atomic layer deposition" (ALD) may refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "chemical vapor deposition" (CVD) may refer to any process wherein a substrate is exposed to one or more volatile precursors, which react and/or decompose on a substrate surface to produce a desired deposition.

As used herein, the term "film" and "thin film" may refer to any continuous or non-continuous structures and material deposited by the methods disclosed herein. For example, "film" and "thin film" could include 2D materials, nanorods, nanotubes, or nanoparticles or even partial or full molecular layers or partial or full atomic layers or clusters of atoms and/or molecules. "Film" and "thin film" may comprise material or a layer with pinholes, but still be at least partially continuous.

As used herein, the term "contaminant" may refer to any unwanted material disposed within the reaction chamber that may affect the purity of a substrate disposed in the reaction chamber. The term "contaminant" may refer to, but is not limited to, unwanted deposits, metal and non-metal particles, impurities, parasitic plasma, and waste products, disposed within the reaction chamber.

Disclosed herein, according to various embodiments, is a susceptor assembly of a reactor system that is generally configured to facilitate plasma control. In various embodiments, the reactor system is a plasma apparatus and the susceptor assembly comprises one or more electrodes that affect plasma generation in order to inhibit parasitic plasma within the reaction chamber. As described in greater detail below, the term "parasitic plasma" refers to plasma that adversely affects the substrate processing. For example, "parasitic plasma" may refer to plasma generated in undesired locations or areas within the reaction chamber, such as below or on the sides of the susceptor. In various embodiments, the susceptor assembly and associated reactor system disclosed herein is generally configured to facilitate control of capacitively coupled plasma, as described in greater detail below.

Figure 1:
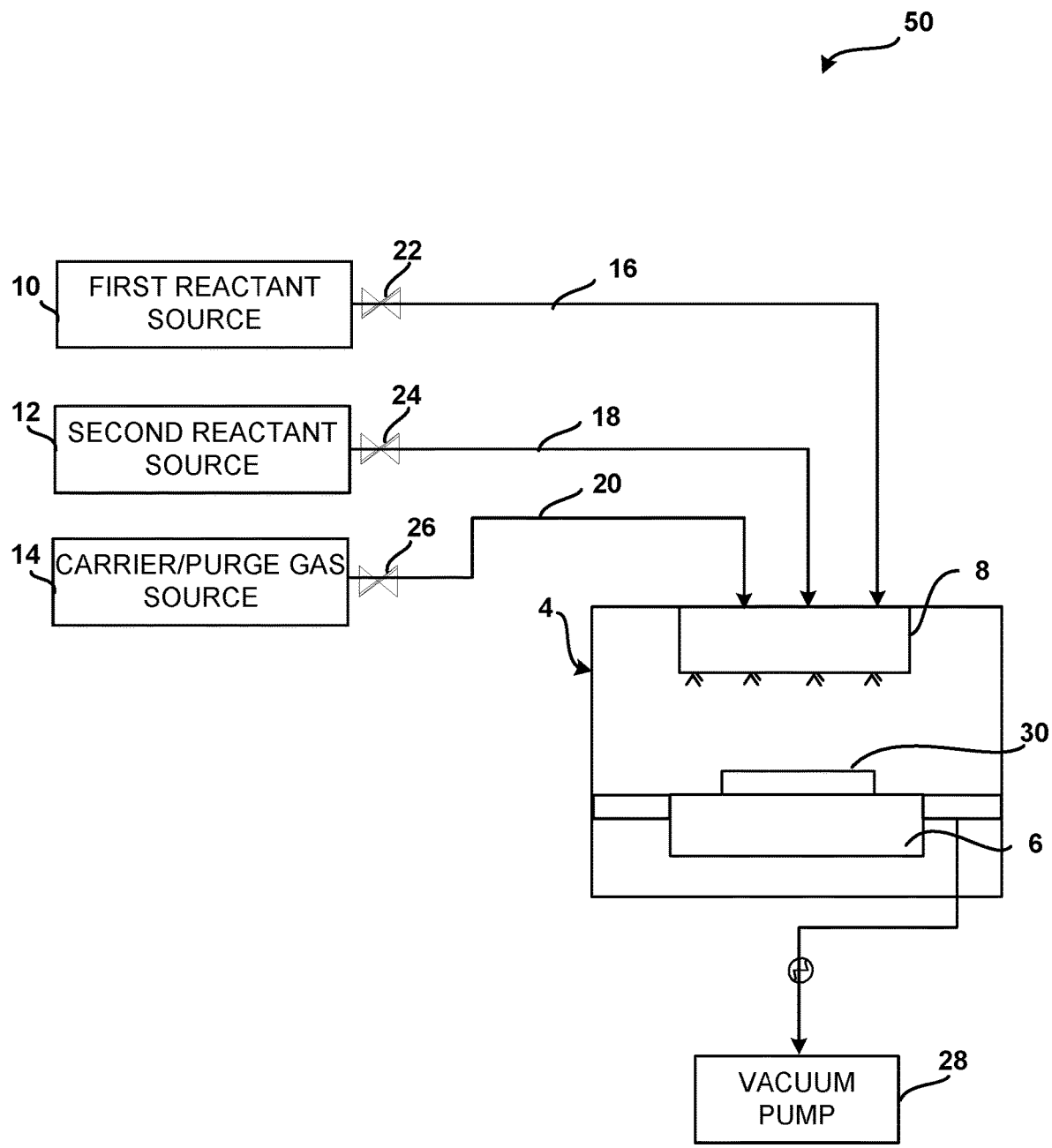
FIG. 1 is a schematic diagram of an exemplary reactor system, in accordance with various embodiments.

Reactor systems used for ALD, CVD, and/or the like, may be used for a variety of applications, including depositing and etching materials on a substrate surface. In various embodiments, with reference to FIG. 1, a reactor system 50 may comprise a reaction chamber 4, a susceptor 6 to hold a substrate 30 during processing, a fluid distribution system 8 (e.g., a showerhead) to distribute one or more reactants to a surface of substrate 30, one or more reactant sources 10, 12, and/or a carrier and/or purge gas source 14, fluidly coupled to reaction chamber 4 via lines 16-20 and valves or controllers 22-26. System 50 may also comprise a vacuum source 28 fluidly coupled to the reaction chamber 4.

As described in greater detail below, various details and embodiments of the disclosure may be utilized in a reaction chamber configured for a multitude of deposition processes, including but not limited to, ALD, CVD, metalorganic chemical vapor deposition (MOCVD), molecular beam epitaxy (MBE), physical vapor deposition (PVD), plasma-enhanced chemical vapor deposition (PECVD), and plasma etching. The embodiments of the disclosure may also be utilized in reaction chambers configured for processing a substrate with a reactive precursor, which may also include etch processes, such as, for example, reactive ion etching (ME), capacitively coupled plasma etching (CCP), and electron cyclotron resonance etching (ECR). In various embodiments, the reactor system has a plasma configuration, such as a capacitively coupled plasma configuration, that utilizes applying radio frequency (RF) power to an atmosphere within a reaction chamber to generate a plasma. Thus, the reactor system may be a capacitively coupled plasma reactor (also referred to herein as a capacitively coupled plasma apparatus), as described in greater detail below starting with reference to FIG. 3B.

Figure 2A:
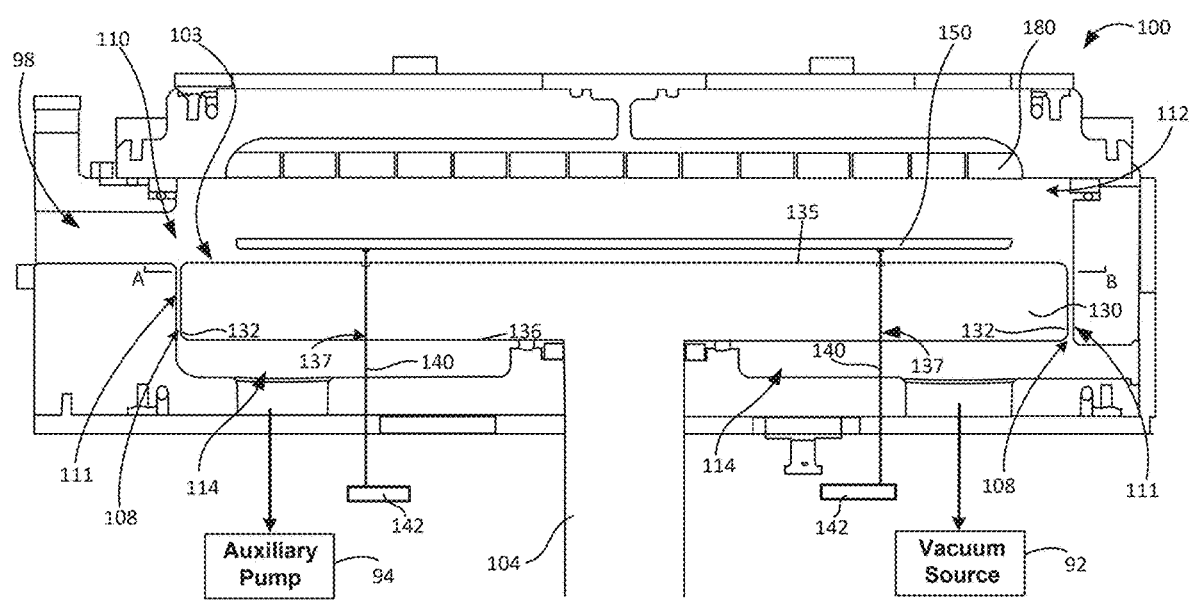
FIG. 2A is a schematic diagram of an exemplary reaction chamber with a susceptor disposed in a lower position, in accordance with various embodiments.
Figure 2B:
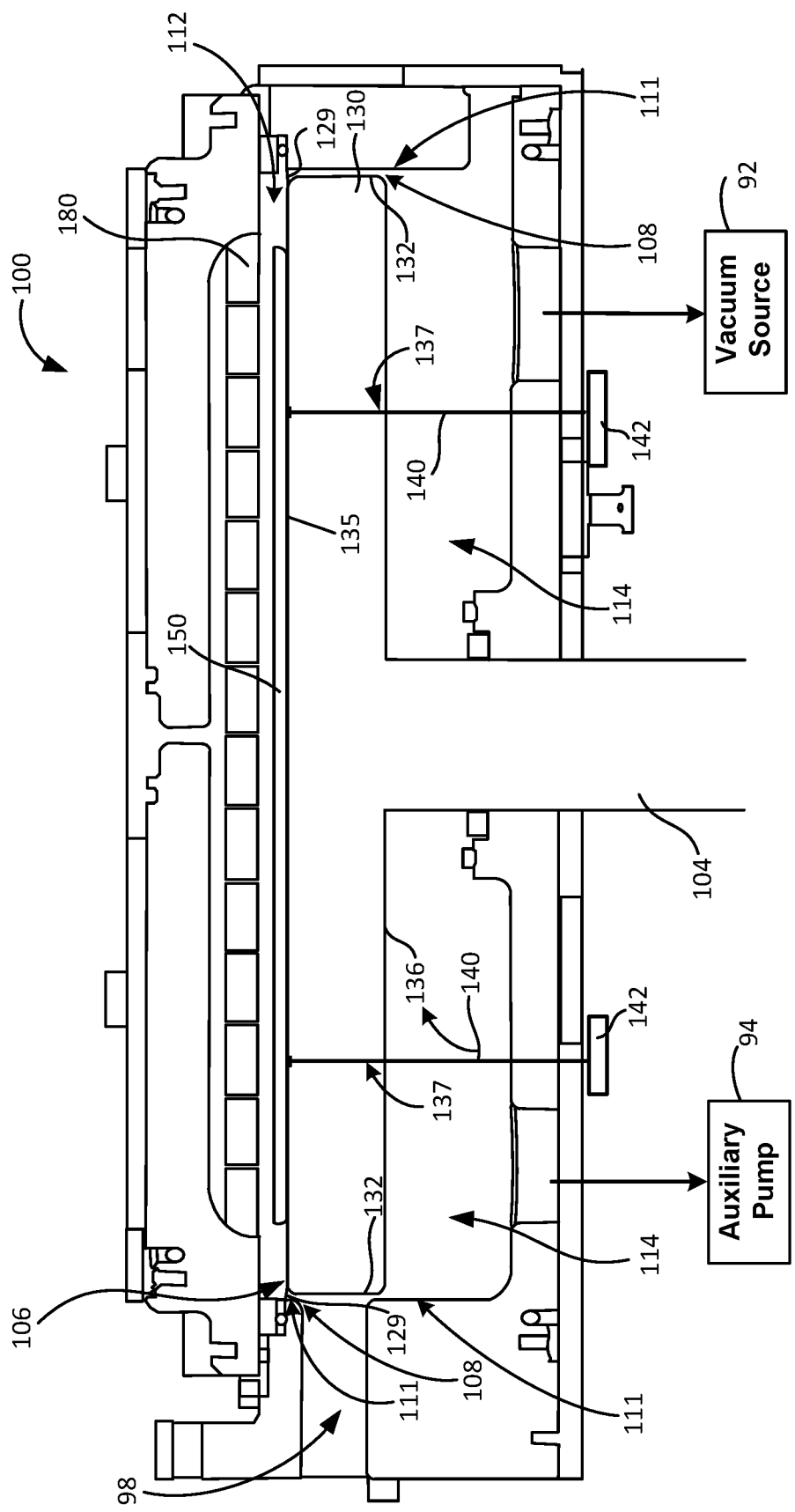
FIG. 2B is a schematic diagram of an exemplary reaction chamber with a susceptor disposed in a raised position, in accordance with various embodiments.

Turning to FIGS. 2A and 2B, the embodiments of the disclosure may include reactor systems and methods that may be utilized for processing a substrate within a reactor system 100. In various embodiments, a reactor system 100 may comprise a reaction chamber 110 for processing substrates. In various embodiments, reaction chamber 110 may comprise a reaction space 112 (i.e., an upper chamber), which may be configured for processing one or more substrates, and/or a lower chamber space 114 (i.e., a lower chamber). Lower chamber space 114 may be configured for the loading and unloading of substrates from the reaction chamber, and/or for providing a pressure differential between lower chamber space 114 and reaction space 112.

In various embodiments, reaction space 112 and lower chamber space 114 may be separated by a susceptor 130 disposed in reaction chamber 110. In various embodiments, reaction space 112 and lower chamber space 114 may be substantially fluidly separate or isolated from one another. For example, a susceptor 130 may fluidly separate reaction space 112 and lower chamber space 114 by creating at least a partial seal (i.e., at least restricting fluid flow) between susceptor 130 and a chamber sidewall 111 of reaction chamber 110 disposed proximate a susceptor outer edge 132 of susceptor 130. That is, space 108 between susceptor 130 and chamber sidewall 111 may be minimized or eliminated such that there is little or no fluid movement between susceptor 130 and chamber sidewall 111.

In various embodiments, to prevent or reduce fluid flow between susceptor 130 and chamber sidewall 111, one or more sealing members (e.g., sealing members 129) may extend from susceptor 130 (e.g., from susceptor outer edge 132) and/or from chamber sidewall 111 of reaction chamber 110 to the other, creating at least a partial seal (i.e., restricting or preventing fluid flow) between susceptor 130 and chamber sidewall 111. The at least partial sealing of reaction space 112 from lower chamber space 114 may be desirable to prevent or reduce precursor gases, and/or other fluids, utilized in the processing of a substrate 150, from entering and/or contacting lower chamber space 114 of reaction chamber 110. For example, the precursor gases utilized for processing substrates in the reaction space may comprise corrosive deposition precursors which may contact lower chamber space 114 producing unwanted deposits/contaminants/particles, which may in turn be reintroduced into reaction space 112, thereby providing a source of contamination to a substrate disposed in the reaction space.

In various embodiments, although sealing members 129 extending between susceptor 130 and chamber sidewall 111 of reaction chamber 110, and/or the at least partial seal formed by direct contact between susceptor 130 and chamber sidewall 111 of reaction chamber 110, may restrict or substantially prevent fluid communication between reaction space 112 and lower chamber space 114 through space 108, it may still be possible for a small volume of precursor gases to enter lower chamber space 114 by diffusion, which may result in possible corrosion, unwanted deposition and contaminants, in the lower chamber of the reaction chamber of the reactor system.

In various embodiments, susceptor 130 may comprise one or more pin holes 137. Each pin hole 137 may span through susceptor 130 from a top surface of susceptor 130 (e.g., a substrate support surface 135 on which substrate 150 may be disposed for processing) to a bottom surface 136 of susceptor 130. The susceptor top surface (e.g., substrate support surface 135) may be the surface of susceptor 130 proximate reaction space 112 of reaction chamber 110. Susceptor bottom surface 136 may be the surface of susceptor 130 proximate lower chamber space 114 of reaction chamber 110. With no lift pin disposed in a pin hole 137, reaction space 112 and lower chamber space 114 may be in fluid communication with one another through pin hole 137. That is, pinhole(s) 137 may be in fluid communication with reaction space 112 and lower chamber space 114.

A lift pin 140 (or other like object) may be disposed in each pin hole 137. Each lift pin may comprise a lift pin body, which is configured to span at least a portion of a pin hole 137 when disposed in pin hole 137. The lift pin body may comprise a cross-sectional shape that is complementary to a cross-sectional shape of pin hole 137. In various embodiments, a pin top surface of each lift pin may be configured to contact substrate 150 to move substrate 150 relative to susceptor 130. For example, lift pin(s) 140 may cause substrate 150 to move up or down relative to susceptor 130 (i.e., increase or decrease the space between substrate 150 and susceptor 130). Disposing the substrate on lift pins may facilitate loading or unloading of the substrate from the reaction chamber, for example, through an opening (e.g., opening 98) in the chamber sidewall.

As discussed, substrate 150 and susceptor 130 may be movable relative to one another. For example, in various embodiments, one or more lift pins 140 may be configured to allow substrate 150 to separate from susceptor 130, and to allow substrate 150 to be placed in contact with (i.e., to be supported by) susceptor 130. In various embodiments, susceptor 130 may move, for example via a susceptor elevator 104, up or down such that susceptor 130 moves relative to substrate 150. In various embodiments, lift pins 140 may move up or down, for example via lift pin elevators/platforms 142 such that substrate 150 moves relative to 130 susceptor. In various embodiments, susceptor 130 and/or lift pins 140 may be stationary while the other is moving. In various embodiments, susceptor 130 and/or lift pins 140 may be configured to move relative to the other.

In various embodiments, the reactor system may comprise a susceptor (e.g., susceptor 130). The substrate (e.g., substrate 150) may be disposed directly on top of the susceptor (e.g., on substrate support surface 135 of susceptor 130) for processing. In various embodiments, a top surface of the susceptor may be disposed on the same plane as substrate support surface 135. In various embodiments, the substrate support surface may be recessed into the susceptor such that there is a recess in the top surface of the susceptor. The recess comprising substrate support surface 135 may comprise a height such that at least a portion of the height of substrate 150 is disposed in the recess. The recess may comprise a height such that, when the substrate is disposed on the substrate support surface and within the recess, the top surface of the substrate is flush with the top surface of the susceptor.

In various embodiments, once substrate 150 is disposed on lift pins 140, susceptor 130 may move from loading position 103 to processing position 106, receiving substrate 150 during such movement. In such embodiments, the pin top end and/or the pin heads or top surfaces of lift pins 140 may be received by pin holes 137, and therefore, substrate 150 may directly contact susceptor 130. In various embodiments, once substrate 150 is disposed on lift pins 140, lift pins 140 may move downward into susceptor 130, such that substrate 150 is received by susceptor 130 (i.e., such that substrate 150 rests on substrate support surface 135). In response, the pin top ends may be flush with and/or below substrate support surface 135. Substrate 150 may be subsequently processed within the reaction chamber.

Figure 3A:
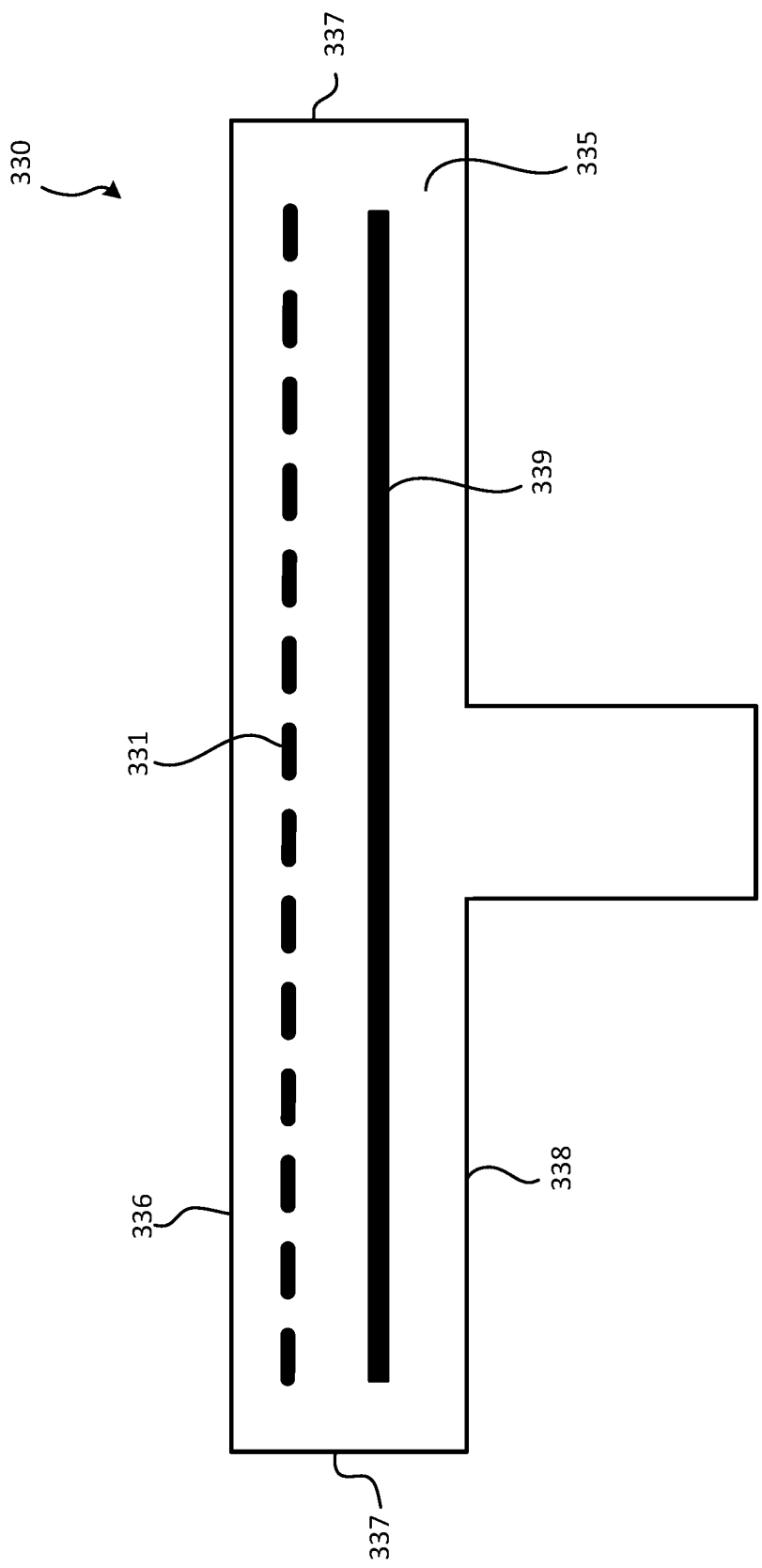
FIG. 3A is a schematic cross-sectional view of a susceptor assembly having a heater element and an electrode, in accordance with various embodiments.

In various embodiments, and with reference to FIG. 3A, a susceptor assembly 330 is provided with a heater element 339 and a first electrode 331 embedded within a body 335 of the susceptor assembly 330. The susceptor assembly 330 may be the same or similar to the susceptors 6, 130 described above with reference to FIGS. 1, 2A, and 2B, or the susceptor assembly 330 may at least include some or all of the features of the aforementioned susceptors 6, 130. Generally, the body 335 of the susceptor assembly 330 comprises a top surface 336 for supporting a substrate (also referred to herein as a substrate support surface), a side surface 337, and a bottom surface 338, according to various embodiments. The first electrode 331 may be generally disposed within the body 335 between the heater element 339 and the top surface 336. As described in greater detail below, the first electrode 331 may be generally configured to operate as one electrode of a capacitively coupled circuit.

As used herein, when an electrode is said to be coupled to or embedded within a component, the electrode may occupy, span, or may be generally disposed proximate to at least a certain portion of said component. Thus, a reactor system that includes one or more electrodes may comprise multiple electrodes coupled to, or comprised in, a section, segment or portion of the reactor system. In various embodiments, the electrodes may span, or be disposed at or proximate to, different portions of the susceptor and/or different portions of the substrate support surface of the susceptor. The electrodes may span along the same plane (e.g., a plane proximate, adjacent, parallel, and/or abutting the substrate support surface of the substrate). An electrode may be disposed within a susceptor such that the plane along which the electrode spans is approximately 0.1 centimeter (cm) away from the substrate support surface of the susceptor within the susceptor body (wherein "approximately in this context means plus or minus 0.05 cm).

Figure 3B:
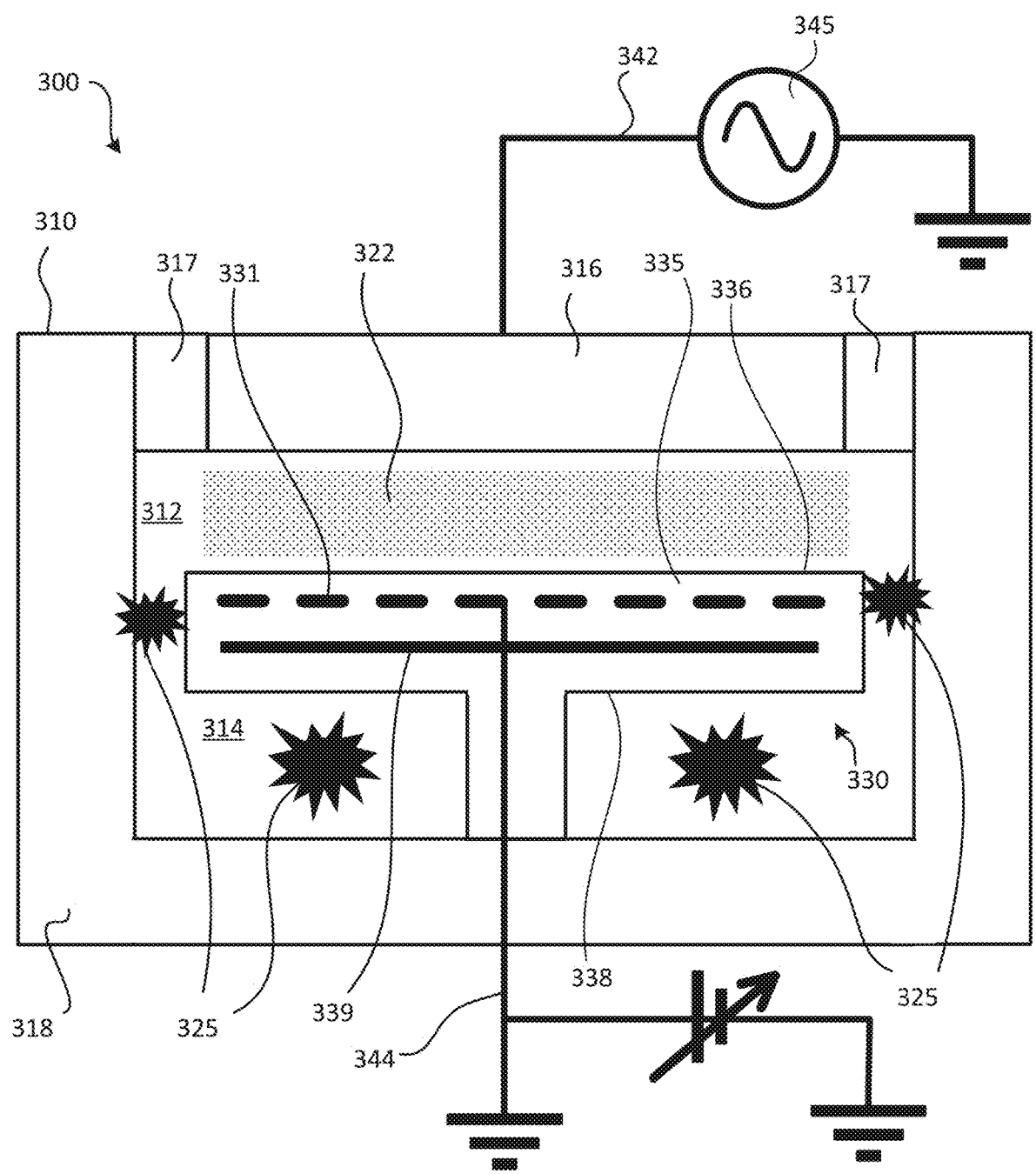
FIG. 3B is a schematic cross-sectional view of a reactor system having a susceptor assembly and a capacitively coupled plasma configuration, in accordance with various embodiments.

In various embodiments, and with reference to FIG. 3B, a reactor system 300 is provided with the susceptor assembly 330 from FIG. 3A and with a housing 310 generally defining a reaction space or chamber within which the susceptor assembly 330 is disposed. The reactor system 300 may be the same or similar to the reactor systems 50, 100 described above with reference to FIGS. 1, 2A, and 2B, or the reactor system 300 may at least include some or all of the features of the aforementioned reactor systems 50, 100. For example, although no substrate is shown in the remaining figures in order to avoid obscuring various aspects of the depictions, in operation a substrate would be supported by the susceptor assembly. The body 335 of the susceptor assembly 330 generally divides the chamber into an upper chamber 312, defined between an upper portion 316 of the housing 310 and the top surface 336 of the body 335 of the susceptor assembly 330, and a lower chamber 314, defined between the bottom surface 338 of the body 335 of the susceptor assembly 330 and the lower portion 318 of the housing 310, according to various embodiments.

In various embodiments, the body 335 of the susceptor assembly 330 comprises a ceramic material. Said differently, a bulk material of the body 335 of the susceptor assembly 330 may be a ceramic material. For example, the material of the body 335 of the susceptor assembly 330 may be selected from the group of materials including aluminum nitride (AlN), aluminum oxide ($Al_2O_3$), silicon dioxide ($SiO_2$), silicon carbide (SiC), yttrium oxide ($Y_2O_3$), and boron nitride (BN), among others. In various embodiments, the material of the body of the susceptor assembly of the present disclosure is selected from the group of materials that consists of aluminum nitride (AlN), aluminum oxide ($Al_2O_3$), silicon dioxide ($SiO_2$), silicon carbide (SiC), yttrium oxide ($Y_2O_3$), and boron nitride (BN). The electrodes disclosed herein may be made from a metallic material. For example, the material of the electrode(s) may be selected from the group of materials including molybdenum (Mo), tungsten (W), nickel (Ni), chromium (Cr), tantalum (Ta), and silicon (Si), among others. In various embodiments, the material of the electrode(s) of the present disclosure is selected from the group of materials consisting of molybdenum (Mo), tungsten (W), nickel (Ni), chromium (Cr), tantalum (Ta), and silicon (Si).

The reactor system 300 may include two circuit elements 342, 344 that are respectively coupled to two components of the reactor system 300 in order to operably generate plasma in an atmosphere between the two components. FIG. 3B generally depicts generation of a processing plasma 322 above the top surface 336 of the susceptor assembly 330 (e.g., within the upper chamber 312). As mentioned above, parasitic plasma 325 may be undesirably generated in various locations within the housing 310, and this parasitic plasma 325 may have various negative impacts on the substrate processing. For example, parasitic plasma 325 may be generated on the sides of and/or below the body 335 of the susceptor assembly. For example, the parasitic plasma 325 may be inadvertently generated in response to wired electrical power transfer to/from the heater element and/or the first electrode. That is, the wires that extend through the susceptor assembly 330 to and from the first electrode 331 and/or the heater element 339 may produce an electric field that promotes generation of the parasitic plasma 325. Accordingly, FIG. 3B may depict a processing condition that the present disclosure is intended to mitigate.

As described in greater detail below, and with momentary reference to FIGS. 4A, 4B, 5A, and 5B, the susceptor assembly 430A, 430B may include a second electrode 432 embedded within the body 335 proximate at least one of the side surface 337 and the bottom surface 338, and this second electrode 432 may be configured to provide various plasma control benefits. For example, the second electrode 432 embedded within the body of the susceptor assembly may 1) be electrically grounded and may thus be configured to operably suppress the parasitic plasma 325 (FIG. 3B) and/or 2) the second electrode 432 may be utilized to generate a cleaning plasma 324 below or to the side of the body of the susceptor assembly (e.g., within the lower chamber 314). This configuration of having two electrodes in the susceptor assembly, and the various benefits thereof, are described in more detail below starting with reference to FIG. 4A.

Returning to reference FIG. 3B, more details of the processing plasma 322 are provided. The first electrode 331, as described above, may be disposed adjacent the top surface 336 of the body 335 of the susceptor assembly 330 and another electrode (referred to herein as a third electrode) may be disposed above the top surface 336 of the body 335 of the susceptor assembly. For example, the third electrode may be coupled to or embedded within the upper portion 316 of the housing 310. In order to simplify the schematic depiction of FIG. 3B, the upper portion 316 is generally shown as being electrically connected to the circuit element 344, but in practice this circuit element 344 may be coupled to an electrode embedded within this upper portion 316 or coupled to the upper portion 316 within the upper chamber 312. In various embodiments, with the upper portion 316 being the third electrode, an electrical insulator 317 may be disposed between the upper portion 316 and the remaining sections/portions of the housing 310, thus enabling the third electrode to be electrically insulated from the remainder of the housing 310. As used herein, the material of the electrically insulative sections disclosed herein may be selected from the group of materials including aluminum nitride (AlN), aluminum oxide ($Al_2O_3$), silicon dioxide ($SiO_2$), and silicon carbide (SiC), among others. In various embodiments, the material of the electrically insulative sections of the present disclosure is selected from the group of materials consisting of aluminum nitride (AlN), aluminum oxide ($Al_2O_3$), silicon dioxide ($SiO_2$), and silicon carbide (SiC).

In various embodiments, the term "circuit element" 342, 344 generally refers to the wires and other circuitry electrically connected to opposing electrodes and configured to generate capacitively coupled plasma. Said differently, a circuit element may include the means for electrical current flow to/from the electrodes. One or both of the circuit elements of a pair of electrodes may be electrically grounded. In various embodiments, one of the circuit elements (e.g., circuit element 342) includes a radio frequency (RF) generator 345 and the other circuit element (e.g., circuit element 344) is electrically grounded, thus operably enabling an electric field to be created between the electrodes, which generates the plasma. Thus, the reactor system 300 may include an RF generator electrically coupled in RF power providing communication to one of the first electrode 331 and the third electrode (e.g., upper portion 316) with the other of the first electrode 3331 and the third electrode being electrically grounded, thereby enabling generation of the processing plasma 322 within the upper chamber 312.

In various embodiments, the circuit element(s) may comprise tunable circuits that are configured to provide an adjustable flow of current, thereby enabling the resultant capacitively coupled plasma to be tuned. For example, during substrate processing (e.g., during atomic layer deposition, chemical vapor deposition (CVD), and/or the like), an electric field may form between the electrodes as electrons travel therebetween, and these electric fields may be controlled and tuned in order to provide desired plasma generation parameters.

Figure 4A:
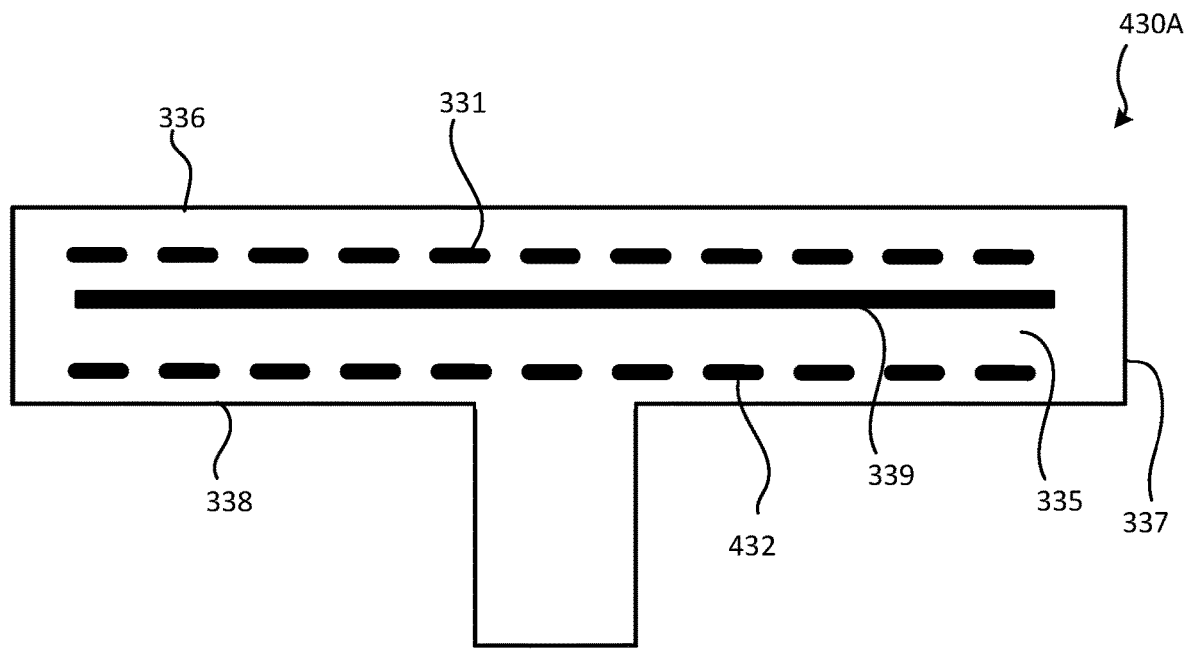
FIG. 4A is a schematic cross-sectional view of a susceptor assembly having a heater element, a first electrode, and a second electrode, in accordance with various embodiments.
Figure 4B:
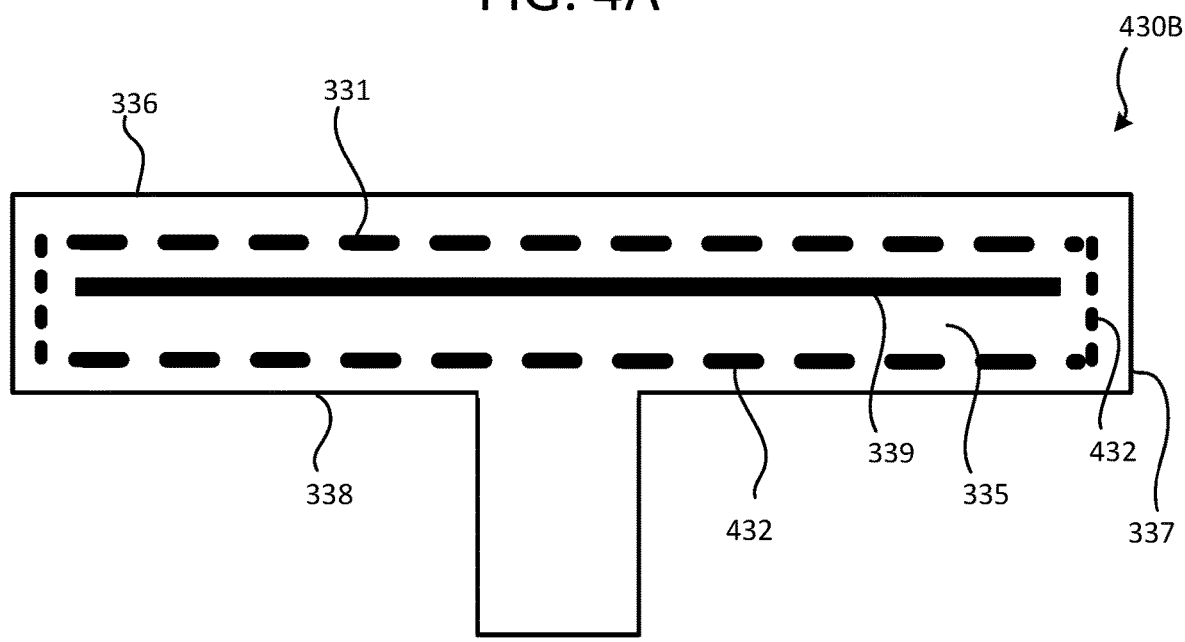
FIG. 4B is a schematic cross-sectional view of a susceptor assembly having a heater element, a first electrode, and a second electrode, in accordance with various embodiments.

In various embodiments, and with reference to FIG. 4A, the susceptor assembly 430A includes the second electrode 432 embedded within the body 335 of the susceptor assembly 430A. The second electrode 432 may be a solid plate/panel or the second electrode may comprises a mesh material or may otherwise have a mesh configuration. Said differently, the second electrode 432 may have a mesh structure disposed proximate the bottom and/or side surfaces of the body of the susceptor assembly. As shown in FIG. 4A, the second electrode 432 may extend along the bottom surface 338 of the body 335 of the susceptor assembly 430A. Thus, the heater element 339 may be disposed between the first electrode 331 and the second electrode 432. As shown in FIG. 4B, susceptor assembly 430B may have the second electrode 432 disposed along the side surface 337 of the body 335. In various embodiments, the second electrode 432 is embedded within the body 335 so as to extend along and proximate to both the bottom surface 338 and the side surface 337.

Figure 5A:
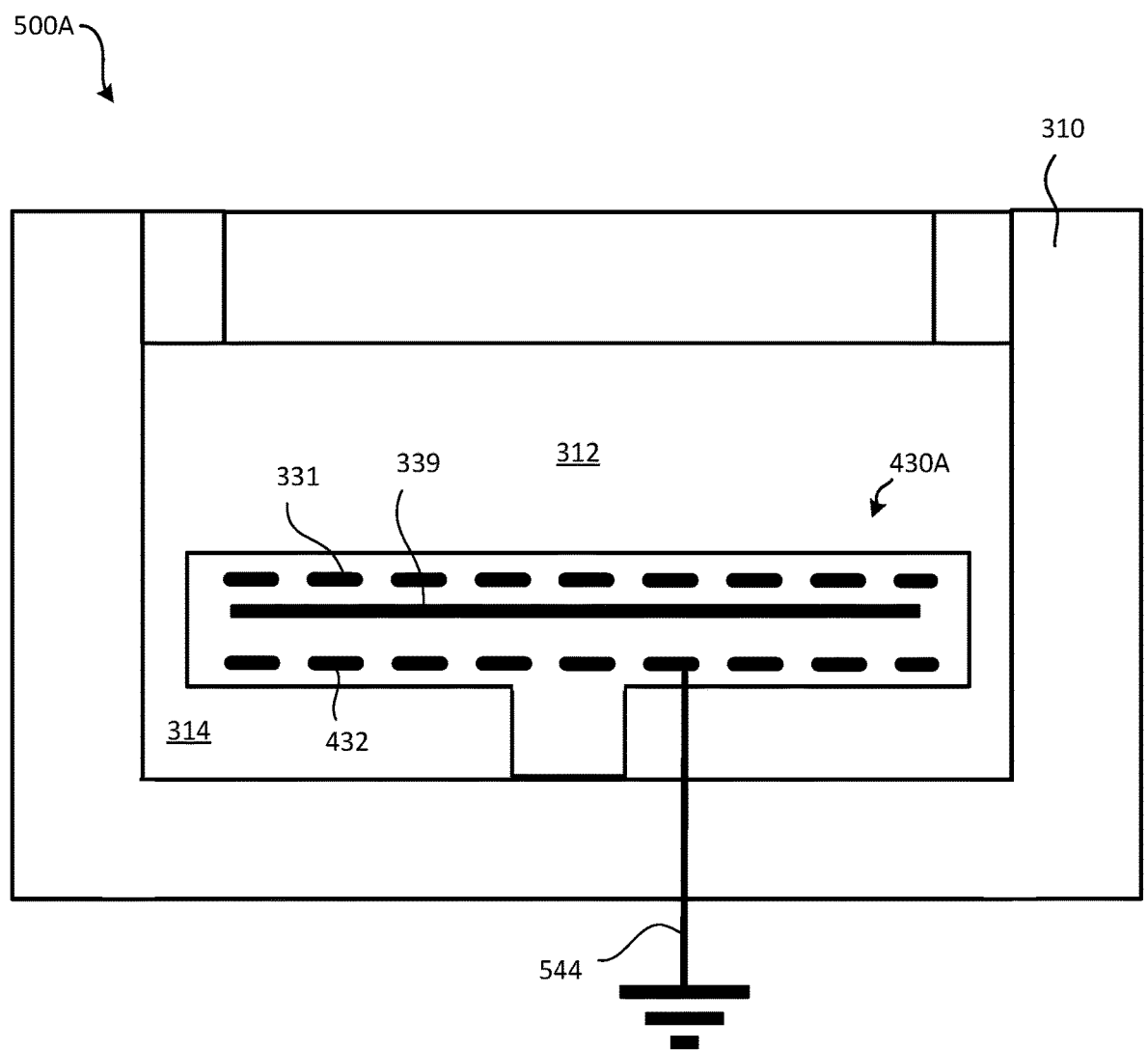
FIG. 5A is a schematic cross-sectional view of a reactor system having a susceptor assembly with a second electrode configured to operably suppress parasitic plasma, in accordance with various embodiments.
Figure 5B:
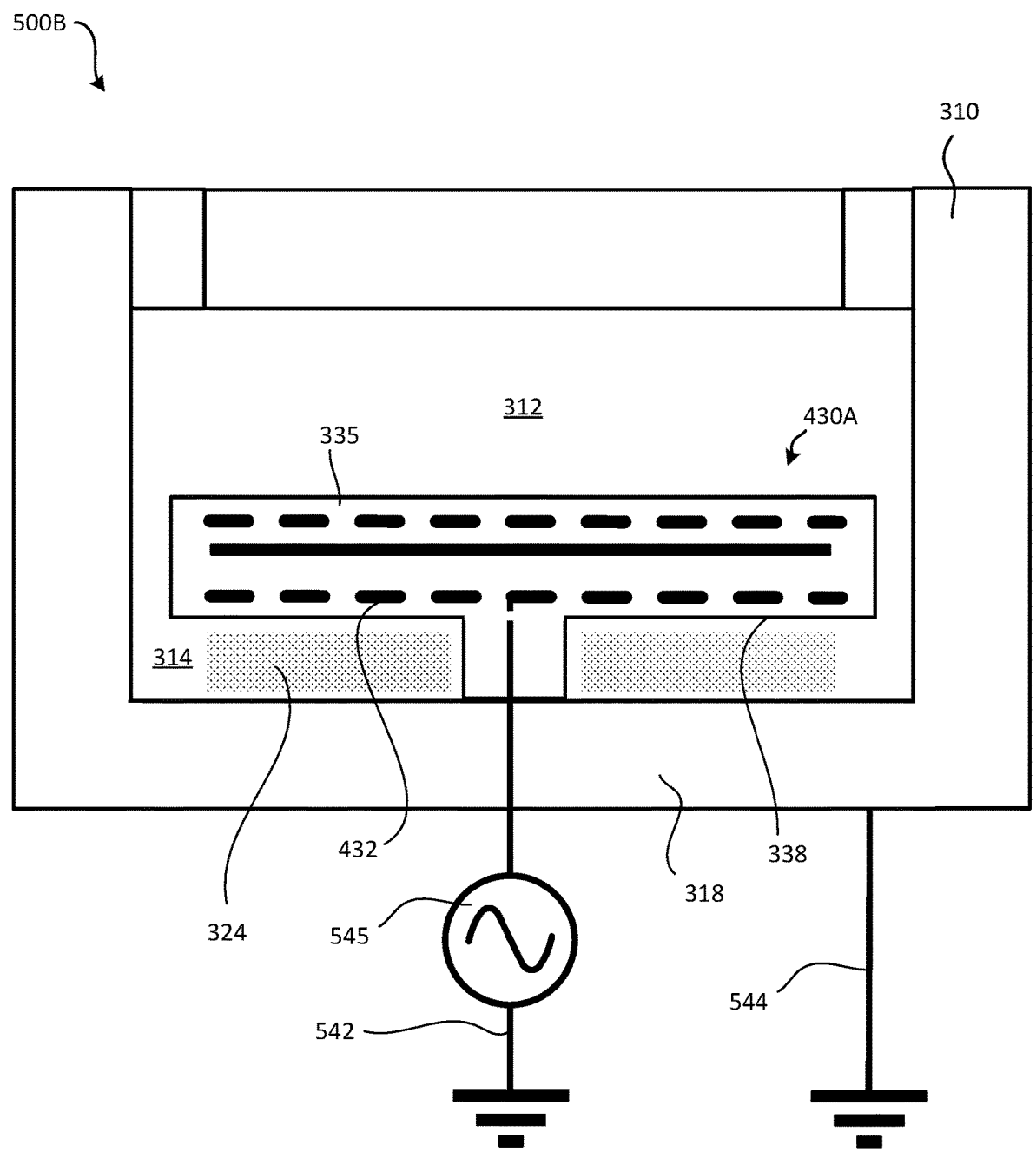
FIG. 5B is a schematic cross-sectional view of a reactor system having a susceptor assembly and a capacitively coupled plasma configuration for generating plasma below the susceptor assembly, in accordance with various embodiments.

In various embodiments, and with reference to FIGS. 5A and 5B, various benefits of incorporating the second electrode 432 into the susceptor assembly are provided. While the susceptor assembly 430A of FIG. 4A, having the second electrode proximate the bottom surface 338, is shown in the reactor system 500A, 500B of FIGS. 5A and 5B, the susceptor assembly 430B of FIG. 4B, having the second electrode disposed proximate the side surface 337, may also be implemented in reactor systems 500A, 500B. As introduced above, the second electrode 432 may provide various benefits, including the mitigation of parasitic plasma and facilitating generation of a cleaning plasma. FIG. 5A shows, according to various embodiments, a reactor system 500A with the second electrode 432 configured to provide the parasitic plasma mitigation benefit and FIG. 5B shows, according to various embodiments, a reactor system 500B with the second electrode configured to provide the cleaning plasma benefit. These configurations are not mutually exclusive, and thus the reactor system 500A, 500B may be configured to operate according to multiple modes, such as a parasitic plasma inhibiting mode and a cleaning plasma mode.

In various embodiments, and with reference to FIG. 5A, the second electrode 432 is configured to be electrically grounded via circuit element 544. Thus, the second electrode 432 may be electrically grounded to suppress parasitic plasma around at least one of the bottom surface and the side surface of the body of the susceptor assembly. In various embodiments, this electrical grounding of the second electrode 432 may help to isolate plasma generation to the upper chamber 312 (i.e., the processing plasma 322 of FIG. 3B). For example, the second electrode 432 may be configured to reduce the surface potential of susceptor assembly 430A, specifically the heater element 339, to suppress the parasitic plasma. Thus, the surface potential of the susceptor assembly 430A that would normally result as a byproduct of RF power, heater power, or other electrical power communication to/from the susceptor assembly 430A is lowered. That is, with the second electrode 432 electrically grounded, the heater power and ESC voltage from heater element 539 are cut off, and the potential of the heater element is lowered (e.g., becomes zero). When the surface potential of the ceramic heater is decreased, the parasitic plasma is mitigated.

In various embodiments, and with reference to FIG. 5B, the reactor system 500B includes circuit elements 542, 544, with one of the circuit elements comprising an RF generator 545. In various embodiments, the reactor system 500B includes another electrode (referred to herein as a fourth electrode) disposed below the bottom surface 338 of the body 335 of the susceptor assembly 430A. For example, the fourth electrode may be coupled to, embedded within, or generally disposed proximate the lower surface of the lower portion 318 of the housing 310. For the purposes of simplicity, the lower portion 318 of the housing 310 is generally shown as being electrically connected to the circuit element 544, but in practice this circuit element 544 may be coupled to an electrode embedded within this lower portion 318 or coupled to the lower portion 318 within the lower chamber 314 (e.g., see FIG. 6). In various embodiments, with the lower portion 318 of the housing 310 being the fourth electrode, an electrical insulative material may be disposed between the lower portion 318 and the remaining sections/portions of the housing 310, thus enabling the fourth electrode to be electrically insulated from the remainder of the housing 310.

The RF generator 545 of one of the circuit elements 542 may be coupled to one of the second electrode and the fourth electrode while the other of the second electrode and the fourth electrode is electrically grounded. Such a configuration is capable of generating a cleaning plasma 324 in the lower chamber 314. The cleaning plasma 324 may be configured to enable rapid cleaning/etching of the lower chamber 314, thus allowing for the reactor system 500B to rapidly remove film residue or other contaminants from this area of the reactor, thus improving throughput over conventional reactors (which may take longer to clean this area/region of the reactor), according to various benefits. Accordingly, disclosed herein is a method of cleaning a reactor comprising activating generation of a cleaning plasma in the lower chamber using opposing electrodes, one disposed in a lower region of the susceptor and another disposed adjacent the lower portion of the housing that defines the lower chamber. For example, the RF generator 545 of a first circuit element 542 is electrically coupled in RF power providing communication to the second electrode 432, with the lower portion 318 of the housing 310 electrically grounded, thereby operably generating an electric field between the second electrode 432 and the lower portion 318 of the housing 310 to create the cleaning plasma 324 below the bottom surface 338 of the body 335 of the susceptor assembly 430A.

Figure 6:
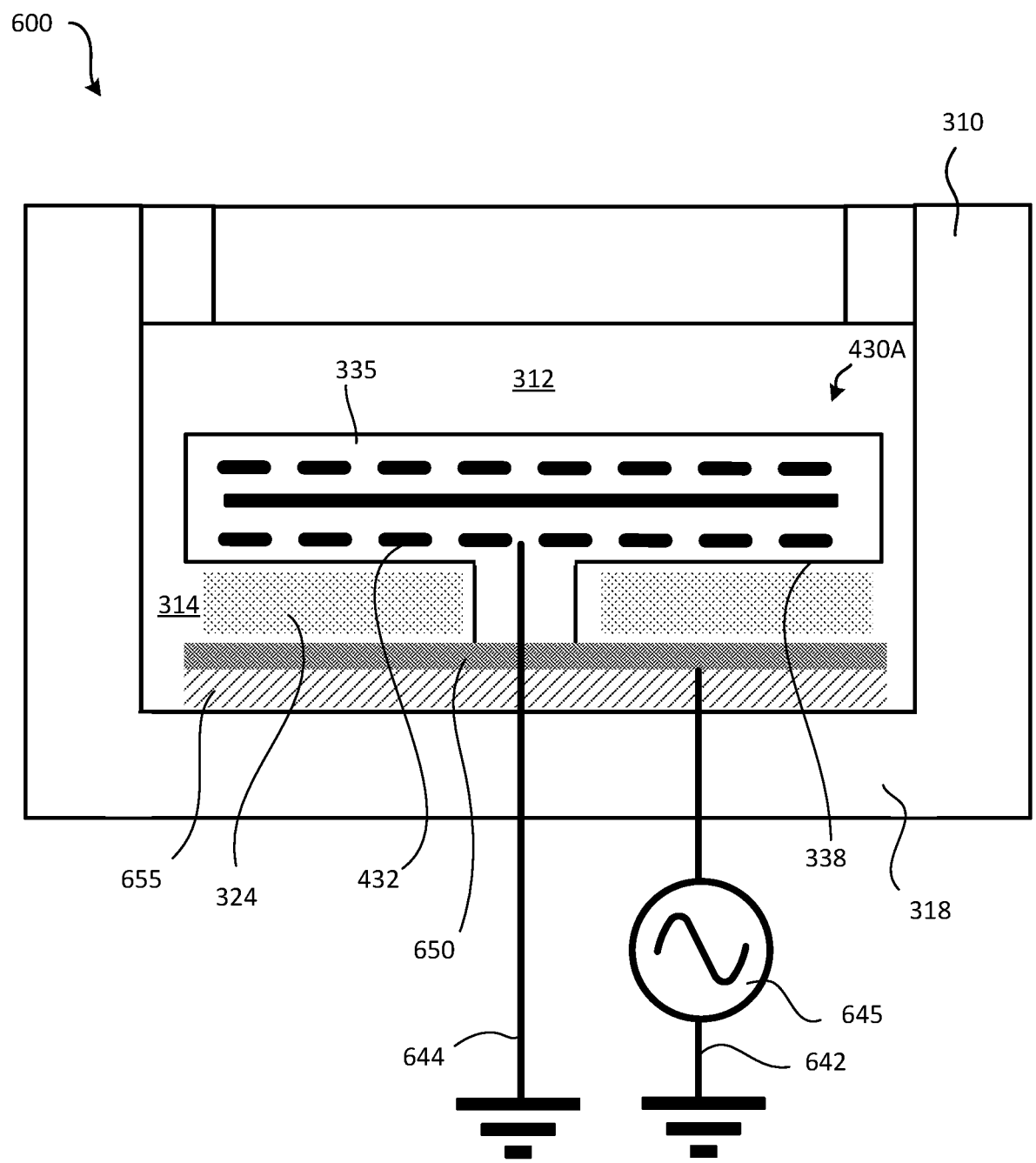
FIG. 6 is a schematic cross-sectional view of a reactor system having a susceptor assembly, a metal plate, and a capacitively coupled plasma configuration for generating plasma below the susceptor assembly, in accordance with various embodiments.

In various embodiments, and with reference to FIG. 6, the fourth electrode of the reactor system 600 may be a metal plate 650 disposed in the lower chamber 314 adjacent the lower portion 318 of the housing 310. That is, the metal plate 650 may be disposed below the bottom surface 338 of the susceptor assembly 430A such that a gap is defined between the metal plate 650 and the bottom surface 338 of the susceptor assembly 430A where the cleaning plasma 324 may be generated. The material of the metal plate 650 may be selected from the group of materials including aluminum (Al), stainless steel, titanium (Ti), and silicon (Si), among others. In various embodiments, the material of the metal plate 650 may be selected from the group of materials consisting of aluminum (Al), stainless steel, titanium (Ti), and silicon (Si).

In various embodiments, an RF generator 645 of a first circuit element 642 may be electrically coupled in RF power providing communication to one of the second electrode 432 and the fourth electrode (e.g., the metal plate 650), with the other of the second electrode 432 and the fourth electrode (e.g., the metal plate 650) electrically grounded, thereby operably generating an electric field between the second electrode 432 and the fourth electrode to create the cleaning plasma 324. In various embodiments, the reactor system 600 may include an electrically insulative layer 655 between the metal plate 650 and the lower portion 318 of the housing 310 to electrically insulate the metal plate 650 from the housing 310. This electrically insulative layer 655 may be a ceramic insulator.

With the fourth electrode being a metal plate 650, the body of the susceptor assembly may comprise a metallic material (instead of a ceramic material). Said differently, a bulk material of the body of the susceptor assembly may be a metallic material. For example, the material of the body of the susceptor assembly may be selected from the group of materials including aluminum (Al), stainless steel, and titanium (Ti), among others. In various embodiments, the material of the body of the susceptor assembly of the present disclosure is selected from the group of materials that consists of aluminum (Al), stainless steel, and titanium (Ti).

In various embodiments, and with reference to FIGS. 7A, 7B, and 7C various surface features of various implementations of the metal plate 650 are provided. In various embodiments, the upper surface of the metal plate 650 has a series or pattern of protrusions (FIG. 7A) to facilitate generation of the cleaning plasma 324. Said differently, the metal plate 650 may have a protruded surface. In various embodiments, the upper surface of the metal plate 650 has a series or pattern of recesses (FIGS. 7B and 7C). The recesses may be defined by cylindrical or straight sidewalls such that the recesses have a flat bottom (FIG. 7B), and thus the metal plate 650 may have an extruded surface. In various embodiments, the recesses may be conical such that sidewalls that define the recesses are tapered/oblique, and thus the metal plate 650 may have a conical extruded surface.

In various embodiments, and with reference to FIG. 8, the reactor system 800 includes a multi-zone electrode configuration for generating multiple zones of cleaning plasma 824A, 824B. The reactor system 800 may include two RF generators, such as a first RF generator 845A of a first circuit element 842A and a second RF generator 845B of a second circuit element 842B. The second electrode may include a first zone 832A and a second zone 832B. The first RF generator 845A may be electrically coupled in RF power providing communication with the first zone 832A of the second electrode and the second RF generator 845B may be separately electrically coupled in RF power providing communication with the second zone 832B of the second electrode. The respective RF power generators may be individually controlled to provide different electric fields in order to tune the cleaning plasma. Thus, in this configuration, multiple zones of cleaning plasma can be generated. For example, a first zone of cleaning plasma 824A may be generated between the first zone 832A of the second electrode and the fourth electrode (e.g., the lower portion 318 of the housing 310, which may be electrically grounded via circuit element 844), while a second zone of cleaning plasma 824B may be generated between the second zone 832B of the second electrode and the fourth electrode.

In various embodiments, the first zone 832A of the second electrode may be at or proximate an outer (i.e., edge) portion of the lower region of the body of the susceptor assembly, and the second zone 832B of the second electrode may be at or proximate an inner (i.e., center) portion of the susceptor. As another example, the susceptor may divided up into quadrants or portions, and a zone of the second electrode may be disposed at or proximate, or may span along, each quadrant or portion of the susceptor. Each electrode zone may be separately coupled to its own circuit element (e.g., RF generator).

In various embodiments, and with reference to FIG. 9, the reactor system 900 includes a multi-zone electrode configuration for generating multiple zones of processing plasma 922A, 922B. The reactor system 900 may include two RF generators, such as a first RF generator 945A of a first circuit element 942A and a second RF generator 945B of a second circuit element 942B. The first electrode may include a first zone 931A and a second zone 931B. The first RF generator 945A may be electrically coupled in RF power providing communication with the first zone 931A of the first electrode and the second RF generator 945B may be separately electrically coupled in RF power providing communication with the second zone 931B of the first electrode. The respective RF power generators may be individually controlled to provide different electric fields in order to tune the processing plasma. Thus, in this configuration, multiple zones of processing plasma can be generated. For example, a first zone of processing plasma 922A may be generated between the first zone 921A of the first electrode and the third electrode (e.g., the upper portion 316 of the housing 310, which may be electrically grounded via circuit element 944A), while a second zone of processing plasma 922B may be generated between the second zone 931B of the first electrode and the third electrode.

In various embodiments, the first zone 931A of the first electrode may be at or proximate an outer (i.e., edge) portion of the upper region of the body of the susceptor assembly, and the second zone 931B of the first electrode may be at or proximate an inner (i.e., center) portion of the susceptor. As another example, the susceptor may divided up into quadrants or portions, and a zone of the first electrode may be disposed at or proximate, or may span along, each quadrant or portion of the susceptor. Each electrode zone may be separately coupled to its own circuit element (e.g., RF generator). In various embodiments, the reactor system 900 further includes another circuit element 944B configured to electrically ground the second electrode 932, thereby providing the aforementioned benefit of reducing parasitic plasma during generation of the processing plasma zones.

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the disclosure.

Reference throughout this specification to features, advantages, or similar language does not imply that all of the features and advantages that may be realized with the present disclosure should be or are in any single embodiment of the invention. Rather, language referring to the features and advantages is understood to mean that a specific feature, advantage, or characteristic described in connection with an embodiment is included in at least one embodiment of the subject matter disclosed herein. Thus, discussion of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize that the subject matter of the present application may be practiced without one or more of the specific features or advantages of a particular embodiment. In other instances, additional features and advantages may be recognized in certain embodiments that may not be present in all embodiments of the disclosure. Further, in some instances, well-known structures, materials, or operations are not shown or described in detail to avoid obscuring aspects of the subject matter of the present disclosure. No claim element is intended to invoke 35 U.S.C. 112(f) unless the element is expressly recited using the phrase "means for."

The scope of the disclosure is to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. Further, the term "plurality" can be defined as "at least two." As used herein, the phrase "at least one of", when used with a list of items, means different combinations of one or more of the listed items may be used and only one of the items in the list may be needed. The item may be a particular object, thing, or category. Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A, B, and C. In some cases, "at least one of item A, item B, and item C" may mean, for example, without limitation, two of item A, one of item B, and ten of item C; four of item B and seven of item C; or some other suitable combination.

All ranges and ratio limits disclosed herein may be combined. Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Any reference to attached, fixed, connected or the like may include permanent, removable, temporary, partial, full and/or any other possible attachment option. Additionally, any reference to without contact (or similar phrases) may also include reduced contact or minimal contact. In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

Although exemplary embodiments of the present disclosure are set forth herein, it should be appreciated that the disclosure is not so limited. For example, although reactor systems are described in connection with various specific configurations, the disclosure is not necessarily limited to these examples. Various modifications, variations, and enhancements of the system and method set forth herein may be made without departing from the spirit and scope of the present disclosure.

The subject matter of the present disclosure includes all novel and nonobvious combinations and subcombinations of the various systems, components, and configurations, and other features, functions, acts, and/or properties disclosed herein, as well as any and all equivalents thereof.

What is claimed is:

1. A reactor system comprising a capacitively coupled plasma configuration, the reactor system comprising:
   a susceptor assembly comprising:
      a body comprising a top surface, a side surface, and a bottom surface, wherein the top surface is a substrate support surface;
      a heater element embedded within the body;
      a first electrode embedded within the body between the heater element and the top surface; and
      a second electrode embedded within the body proximate at least one of the side surface and the bottom surface;
   a housing comprising an upper portion and a lower portion, wherein the housing defines a chamber within which the susceptor assembly is disposed, wherein the body of the susceptor assembly generally divides the chamber into an upper chamber, defined between the upper portion of the housing and the top surface of the body of the susceptor assembly, and a lower chamber, defined between the bottom surface of the body of the susceptor assembly and the lower portion of the housing;
   a metal plate disposed in the lower chamber below the bottom surface of the body of the susceptor assembly, wherein the metal plate comprises a fourth electrode that is electrically insulated from the lower portion of the housing;
   a third electrode disposed above the top surface of the body of the susceptor assembly; and
   an RF generator electrically coupled in RF power providing communication to one of the second electrode and the fourth electrode, with the other of the second electrode and the fourth electrode electrically grounded, thereby operably generating an electric field between the second electrode and the fourth electrode to create a cleaning plasma below the bottom surface of the body of the susceptor assembly,
   wherein the second electrode extends proximate the bottom surface such that the heater element is disposed between the first electrode and the second electrode.

2. The reactor system of claim 1, further comprising an RF generator electrically coupled in RF power providing communication to one of the first electrode and the third electrode, with the other of the first electrode and the third electrode electrically grounded, thereby operably generating an electric field between the first electrode and the third electrode to create a processing plasma above the top surface of the body of the susceptor assembly.

3. The reactor system of claim 2, wherein the second electrode is electrically grounded to operably suppress parasitic plasma around at least one of the side surface and the bottom surface.

4. The reactor system of claim 3, wherein the second electrode comprises a mesh configuration.

5. The reactor system of claim 3, wherein the third electrode is electrically insulated from the lower portion of the housing.

6. The reactor system of claim 1, further comprising a ceramic insulator disposed between the metal plate and the lower portion of the housing.

7. The reactor system of claim 1, wherein the metal plate comprises at least one of a protruded surface, an extruded surface, and a conical extruded surface.

8. The reactor system of claim 1, wherein a bulk material of the body of the susceptor assembly comprises metal.

* * * * *